United States Patent
Tang

(10) Patent No.: US 7,151,304 B2
(45) Date of Patent: Dec. 19, 2006

(54) METHOD TO REDUCE SWITCH THRESHOLD OF SOFT MAGNETIC FILMS

(75) Inventor: Denny D. Tang, Saratoga, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 44 days.

(21) Appl. No.: 11/037,280

(22) Filed: Jan. 18, 2005

(65) Prior Publication Data

US 2005/0122770 A1 Jun. 9, 2005

Related U.S. Application Data

(62) Division of application No. 10/279,266, filed on Oct. 24, 2002, now Pat. No. 6,890,767.

(51) Int. Cl.
*H01L 29/82* (2006.01)
*H01L 43/00* (2006.01)

(52) U.S. Cl. ............... 257/421; 257/414; 257/295; 257/E27; 257/5; 365/171; 365/173

(58) Field of Classification Search ............ 257/421, 257/295, 296, 414, 422, 423, 424, 425, 427
See application file for complete search history.

(56) References Cited

U.S. PATENT DOCUMENTS

| 5,946,228 | A | 8/1999 | Abraham et al. |
| 6,072,718 | A | 6/2000 | Abraham et al. |
| 6,104,633 | A * | 8/2000 | Abraham et al. ........... 365/171 |
| 6,256,223 | B1 | 7/2001 | Sun |
| 6,259,644 | B1 | 7/2001 | Tran et al. |
| 6,365,286 | B1 | 4/2002 | Inomata et al. |
| 6,501,678 | B1 | 12/2002 | Lenssen et al. |
| 6,534,978 | B1 | 3/2003 | Treutler et al. |
| 2004/0080977 | A1 * | 4/2004 | Tang ......................... 365/158 |

* cited by examiner

*Primary Examiner*—David Nhu
(74) *Attorney, Agent, or Firm*—Haynes and Boone, LLP

(57) ABSTRACT

In magnetic memories it is important to be able to switch the states of the memory elements using minimal power i.e. external fields of minimal intensity. This has been achieved by giving each memory element an easy axis whose direction parallels its minimum surface dimension. Then, when the magnetic state of the element is switched by rotating its direction of magnetization, said rotation is assisted, rather than being opposed, by the crystalline anisotropy. Consequently, relative to the prior art, a lower external field is required to switch the state of the element.

6 Claims, 1 Drawing Sheet

METHOD TO REDUCE SWITCH THRESHOLD OF SOFT MAGNETIC FILMS

CROSS-REFERENCE

This application is a divisional of U.S. patent application Ser. No. 10/279,266, filed Oct. 24, 2002 now U.S. Pat. No. 6,890,767, entitled, "Method to Reduce Switch Threshold of Soft Magnetic Films," which is hereby incorporated by reference in its entirety. This application is also related to U.S. patent application Ser. No. 10/255,482, filed Sep. 26, 2002, entitled, "Scalable High Performance MRAM Cell Arrays" (TSMC2002-00059) and U.S. divisional patent application filed on Jan. 18, 2005, under Ser. No. 11/037,280 (TSMC2001-1732/7-16), entitled "Method to Reduce Switch Threshold of Soft Magnetic Films," assigned to a common assignee.

FIELD OF THE INVENTION

The invention relates to the general field of magnetic devices with particular reference to magnetic memory cells.

BACKGROUND OF THE INVENTION

In MRAM (magnetic random access memory), a cell's magnetic state is switched (i.e. its direction of magnetization is rotated) by an external magnetic field. This field is generated by a current through a program line on a chip. It is desirable to lower the switching threshold of MRAM cells so that the write current, and thus the chip power, can be reduced. The free layer in an MRAM cell is typically a soft magnetic film having a rectangular or oval shape.

The direction of the magnetization, M, in a magnetic soft film is determined by the lowest energy state of the film. In the sub-micron geometry film, the shape anisotropy $H_d$ dominates over the crystalline anisotropy $H_K$. The direction of the $H_K$ is usually called the easy axis direction of the film. Its direction is set by a small magnet in the deposition chamber during film deposition. The direction of the film's magnetization M would normally parallel the largest dimension of the cell to minimize demagnetization effects arising from the shape anisotropy due to its dominance in small geometry film, rather than the direction of the crystalline anisotropy. This is illustrated in FIG. 1 where memory element 11 is a rectangle of length 12 and width 13. As a result the magnetization would parallel the direction of 12. Nonetheless, the direction of crystalline anisotropy, or the direction of the easy axis, still plays a role in the magnitude of the switching field of the cell. The present invention discloses a method and structure that lowers the requirements for the switch field of the soft film. It is applicable to the MRAM cells.

A routine search of the prior art was performed with the following references of interest being found:

In U.S. Pat. No. 6,104,633, Abraham et al. show a MRAM and discuss the easy axis of the free layer. Abraham et al. also show related MRAMs in U.S. Pat. No. 6,072,718 and in U.S. Pat. No. 5,946,228. U.S. Pat. No. 6,259,644B (Tran et al.) shows a MRAM with free and pinned layers in anti-parallel directions while Sun discusses switching thresholds in U.S. Pat. No. 6,256,223 B1.

SUMMARY OF THE INVENTION

It has been an object of at least one embodiment of the present invention to provide a magnetic memory element whose state may be switched using a lower field than is required to switch the state of a memory element of the prior art.

Another object of at least one embodiment of the present invention has been to provide a process for manufacturing said memory element.

Still another object of at least one embodiment of the present invention has been that said process not require substantive changes to the processes presently in use for the manufacture of magnetic memory elements.

These objects have been achieved by giving said magnetic memory element an easy axis that parallels the minimum surface dimension of the element. Then, when the magnetic state of the element is switched by rotating its direction of magnetization, said rotation is assisted, rather than being opposed, by the crystalline anisotropy. Consequently, relative to the prior art, a lower external field is required to switch the state of the element.

DESCRIPTION OF THE PREFERRED EMBODIMENTS

Figure 1:
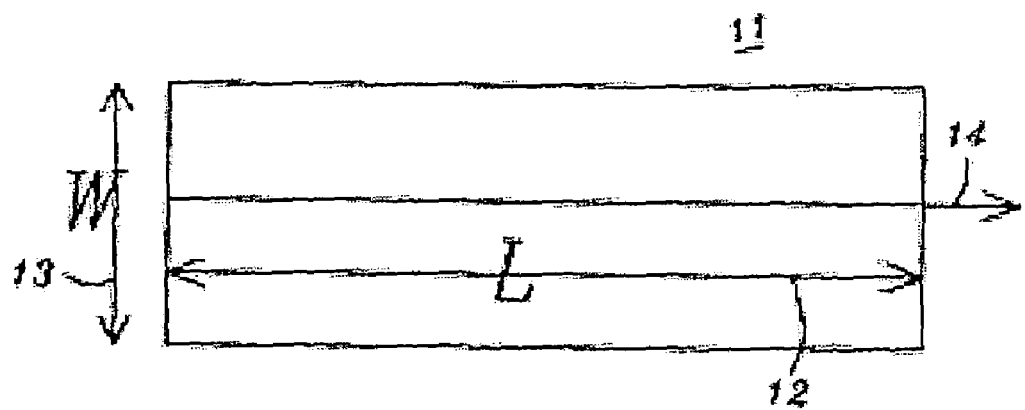
FIG. 1 shows a magnetic memory element of the prior art.
Figure 2:
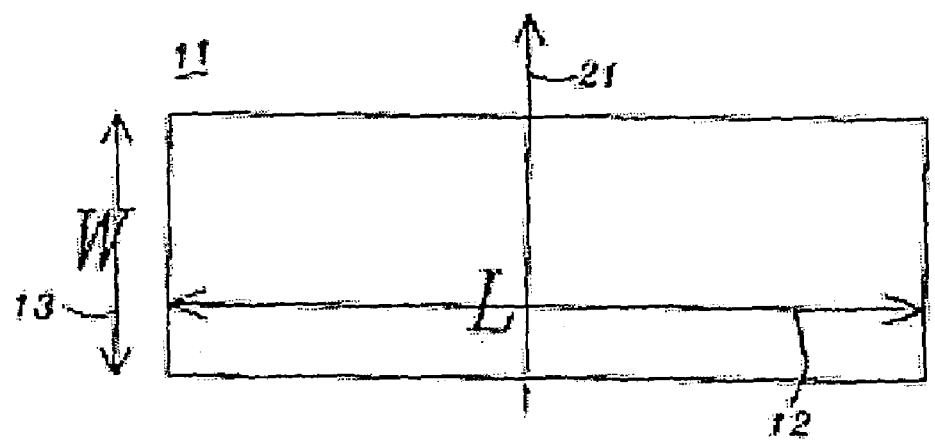
FIG. 2 illustrates the formation of an easy axis along a direction normal to the long direction of the film.

Shown in FIG. 2 is a schematic representation of the key feature of the present invention which is that, at the time the memory element 11 is formed, it is given an easy axis along direction 21 which is normal to the direction (14 in FIG. 1) of the long axis. Note that although we describe the invention in terms of elements having a rectangular shape, it will be understood that it can be applied to any element having at least two planar dimensions that are different, such as ovals, diamonds, and eyes.

Figure 3:
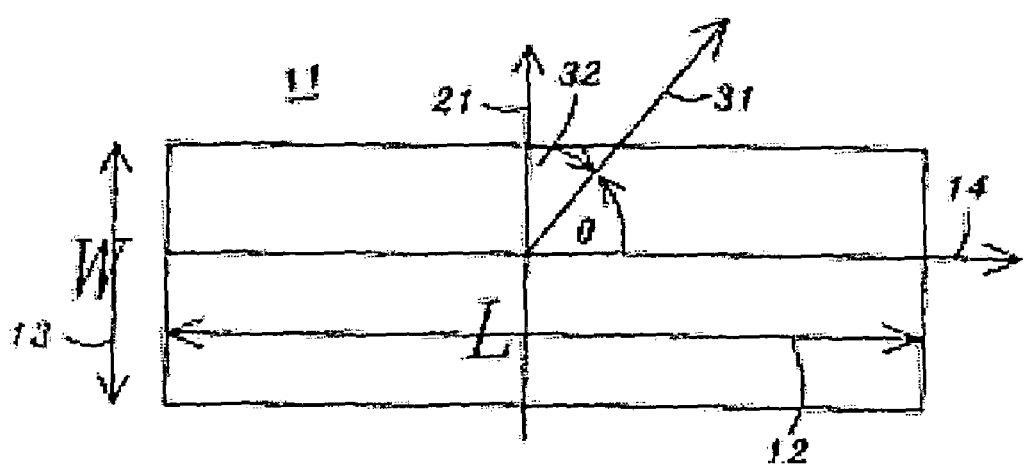
FIG. 3 illustrates the rotation of the magnetization when an external field is applied.

The significance of this change can be seen in the following analysis:

Referring now to FIG. 3, for the sake of reference, the x-axis runs horizontally (west-east) across the figure, along the direction 14 and the y-axis runs vertically (south-north) along the direction 21. We compute the angular change of the direction of magnetization 31 for a memory element of thickness t, magnetization M, when an external field $H_{ext}$ is applied parallel to the Y-axis:

(a) when the easy axis is in the Y direction 21 (present invention):

$$\tan \theta_y = (H_{ext} + H_K + Mt/L)/Mt/W)$$

(b) when the easy axis is in the X direction 14 (prior art):

$$\tan \theta_x = (H_{ext} + H_K + Mt/L)/Mt/W + H_K)$$

Since $\tan \theta_y > \tan \theta_x$ it follows that, to achieve the same degree of rotation of the magnetization in a magnetic memory element, a lower $H_{ext}$ may be used if the easy axis is normal to the element's longest dimension instead of parallel to it.

In a cell array, to change the cell state, say from M pointing east to west, one would need to apply two external fields: one Hx (pointing west) and Hy (pointing north). The external magnetic field Hy will rotate the magnetization M to an angle away from the x-direction. The external field Hx will complete the switch. A value of less than about 50 Oe for the external magnetic field Hy will be sufficient to cause a rotation of the direction of magnetization.

Based on a uniform rotation model, the switching asteroid of a rectangular film can be described as $$H_x^{2/3} + H_y^{2/3} H_o^{2/3}$$

and $$H_o = Mt*(1/W + 1/L) +/- H_K$$

where the sign in front of $H_K$ is determined by the direction of the crystalline anisotropy. When $H_K$ (the easy axis) is along the long axis, positive sign applies, and when along the short axis, negative sign applies. Thus, the switching threshold is lower when $H_K$ is along the short axis.

We now describe a process for manufacturing the memory element described above. The process begins with the deposition of a layer 32 of a soft magnetic material (such as NiFe, CoFe, COFeB, or CoNiFe) on a substrate (to a thickness between about 5 and 50 Angstroms) and then patterning said layer to form a memory element 11 having a minimum dimension 13 and maximum dimension 12, as seen in FIG. 2. In the case where a multiple magnetic soft film stack is deposited, the direction of the easy axis of each layer can be made different by changing the direction of the magnet inside the deposition chamber. The maximum dimension 12 is between about 0.1 and 1.5 microns.

In a second embodiment of the invention, memory element 11 is a stack made up of multiple layers of magnetically soft material separated layers of a non-magnetic material such as Cu, Ru, Pt, Ag, or Au, to a thickness between about 5 and 30 Angstroms.

The advantages of using a stack of several magnetic layers is that the total volume of the soft magnetic material increases and the thermal stability of the memory cell improves. By having the magnetization M in the soft magnetic material in the stack arranged in the anti-parallel direction, the net moment is lowered, which translates to lower switching threshold.

What is claimed is:

1. A magnetic memory element, comprising:
   on a substrate, a layer of a soft magnetic material of a shape that has a minimum and a maximum dimension, parallel to said substrate;
   a magnetization in a direction parallel to said maximum dimension; and
   an easy axis whose direction parallels said minimum dimension.

2. The magnetic memory element described in claim 1 wherein said shape is an oval, a diamond, or an eye.

3. The magnetic memory element described in claim 1 wherein said maximum dimension is between about 0.1 and 1.5 microns.

4. The magnetic memory element described in claim 1 wherein a value of less than about 50 Oe, for said external magnetic field, will be sufficient to cause a rotation of said direction of magnetization.

5. The magnetic memory element described in claim 1 wherein said soft magnetic material is NiFe, CoFe, CoNiFe, or CoFeB.

6. The magnetic memory element described in claim 1 wherein said layer of soft magnetic material has a thickness between about 5 and 50 Angstroms.

* * * * *